(12) United States Patent
Yoshida

(10) Patent No.: US 10,076,044 B2
(45) Date of Patent: Sep. 11, 2018

(54) METHOD FOR MANUFACTURING MULTILAYER WIRING SUBSTRATE

(71) Applicant: HITACHI CHEMICAL COMPANY, LTD., Tokyo (JP)

(72) Inventor: Nobuyuki Yoshida, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 309 days.

(21) Appl. No.: 15/027,756

(22) PCT Filed: Sep. 24, 2014

(86) PCT No.: PCT/JP2014/075257
§ 371 (c)(1),
(2) Date: Apr. 7, 2016

(87) PCT Pub. No.: WO2015/053084
PCT Pub. Date: Apr. 16, 2015

(65) Prior Publication Data
US 2016/0242299 A1    Aug. 18, 2016

(30) Foreign Application Priority Data

Oct. 9, 2013 (JP) .................................. 2013-211871
Jul. 18, 2014 (JP) .................................. 2014-147757

(51) Int. Cl.
*H05K 3/42* (2006.01)
*H05K 3/00* (2006.01)
*H05K 3/46* (2006.01)

(52) U.S. Cl.
CPC ........... *H05K 3/423* (2013.01); *H05K 3/0026* (2013.01); *H05K 3/0035* (2013.01); *H05K 3/421* (2013.01);
(Continued)

(58) Field of Classification Search
CPC .... H05K 3/0026; H05K 3/0035; H05K 3/421; H05K 3/423; H05K 3/4652;
(Continued)

(56) References Cited

U.S. PATENT DOCUMENTS 4,316,322 A * 2/1982 Tranberg ............. H05K 3/0055
134/38
4,425,380 A * 1/1984 Nuzzi ................. H05K 3/0055
134/22.16
(Continued)

FOREIGN PATENT DOCUMENTS

CN    1744801 A    3/2006
CN    1993024 A    7/2007
(Continued)

OTHER PUBLICATIONS

International Search Report of PCT/JP2014/075257 dated Oct. 21, 2014 in English.
(Continued)

*Primary Examiner* — Carl Arbes
(74) *Attorney, Agent, or Firm* — Fitch Even Tabin & Flannery, LLP

(57) ABSTRACT

The present invention is a method for manufacturing a multilayer wiring board having (1) a step of providing with a hole for a via hole from a metal foil for an upper layer wiring pattern to an inner layer wiring pattern by using a conformal method or a direct laser method, and (2) a step of forming a via hole by forming electrolytic filling plating layers in the hole for a via hole, wherein the formation of the electrolytic filling plating layers in the step (2) is carried out by repeating change in electric current density of temporarily decreasing the electric current density of electrolytic filling plating in the middle of the electrolytic filling plating and then increasing it again, two or more times before the
(Continued)

electrolytic filling plating layers block an opening of the hole for a via hole.

5 Claims, 5 Drawing Sheets

(52) U.S. Cl.
CPC ... *H05K 3/4652* (2013.01); *H05K 2201/0355* (2013.01); *H05K 2201/09863* (2013.01); *H05K 2201/2072* (2013.01); *H05K 2203/1184* (2013.01); *H05K 2203/1476* (2013.01); *H05K 2203/1492* (2013.01)

(58) Field of Classification Search
CPC . H05K 2201/0355; H05K 2201/09863; H05K 2201/2072; H05L 2203/1184; H05L 2203/1476

See application file for complete search history.

(56) References Cited

U.S. PATENT DOCUMENTS

| | | | |
|---|---|---|---|
| 5,284,548 A * | 2/1994 | Carey | H05K 3/427 216/105 |
| 6,448,506 B1 | 9/2002 | Glenn et al. | |
| 6,458,696 B1 * | 10/2002 | Gross | H01L 21/2885 205/131 |
| 6,564,454 B1 | 5/2003 | Glenn et al. | |
| 6,708,404 B1 | 3/2004 | Gaku et al. | |
| 6,793,796 B2 * | 9/2004 | Reid | C25D 3/38 205/102 |
| 7,144,805 B2 * | 12/2006 | Chen | C25D 5/02 438/644 |
| 7,521,806 B2 | 4/2009 | Trezza | |
| 7,666,320 B2 | 2/2010 | Kawamura et al. | |
| 7,909,976 B2 * | 3/2011 | Mashino | C25D 5/026 205/104 |
| 8,366,903 B2 | 2/2013 | Kawamura et al. | |
| 8,541,695 B2 | 9/2013 | Ishida et al. | |
| 2005/0051436 A1 * | 3/2005 | Chen | C25D 5/02 205/125 |
| 2007/0170065 A1 | 7/2007 | Mashino | |
| 2009/0301889 A1 | 10/2009 | Reents et al. | |
| 2013/0062210 A1 | 3/2013 | Fushie et al. | |

FOREIGN PATENT DOCUMENTS

| | | |
|---|---|---|
| CN | 101416569 A | 4/2009 |
| CN | 100589682 | 2/2010 |
| CN | 103444275 | 12/2013 |
| JP | 2003-060349 A | 8/2001 |
| JP | 2003318544 A | 11/2003 |
| JP | 2006-070318 A | 3/2006 |
| JP | 2008-021770 A | 7/2006 |
| JP | 2007180359 A | 7/2007 |
| JP | 2008182273 A | 8/2008 |
| JP | 2009021581 A * | 1/2009 |
| JP | 2009117448 A * | 5/2009 |
| JP | 2013-074262 A | 4/2013 |
| JP | 2013077807 A | 4/2013 |
| JP | 2013077809 A | 4/2013 |
| KR | 1020060107053 A * | 10/2006 |
| WO | 2008/153185 A1 | 12/2008 |

OTHER PUBLICATIONS

International Search Report of PCT/JP2014/075255 dated Oct. 28, 2014 in English.
Notice of Allowance of U.S. Appl No. 15/027,784 dated Jan. 3, 2017.
Office Action of CN Patent Application No. 201480055474.4 dated Nov. 23, 2017.
Office Action of CN Patent Application No. 201480055472.5 dated Nov. 23, 2017.
Office Action of CN Patent Application No. 201480055473.X dated Nov. 23, 2017.

* cited by examiner

Step(2-1)

Step(2-3)

METHOD FOR MANUFACTURING MULTILAYER WIRING SUBSTRATE

CROSS-REFERENCE TO RELATED APPLICATIONS

This application is a U.S. national phase application filed under 35 U.S.C. § 371 of International Application No. PCT/JP2014/075257, filed Sep. 24, 2014, designating the United States, which claims priority from Japanese Patent Application Nos. 2013-211871 and 2014-147757, filed Oct. 9, 2013, and Jul. 18, 2014, respectively, which are hereby incorporated herein by reference in their entirety.

TECHNICAL FIELD

The present invention relates to a method for manufacturing a multilayer wiring board and particularly relates to a method for manufacturing a multilayer wiring board in which interlayer connection is formed by using an electrolytic filling plating solution.

BACKGROUND ART

Heretofore, a method for manufacturing a multilayer wiring board has been adopted by integrally laminating a prepreg or a resin film on a wired inner layer material, and a metal foil as an upper layer thereof, creating a hole for a via hole by laser to form a base electroless plating layer, and then filling in the hole for a via hole with an electrolytic plating layer formed by using an electrolytic filling plating solution (hereinafter, also simply referred to as an "electrolytic filling plating layer").

Heretofore, a multilayer wiring board in which the hole for a via hole is not filled in has also been manufactured, and there is a demand for manufacturing a multilayer wiring board by carrying out interlayer connection at a relatively small plating thickness for a via hole whose via diameter (opening size of the hole for a via hole) is about 1.2 times larger or more, i.e., aspect ratio is approximately 0.8 or less, compared with the insulating layer thickness (depth of the hole for a via hole). A method of laminating an insulating resin and a metal foil on an inner layer wiring pattern, opening a non-through hole with a laser hole opening machine, and carrying out electroless copper plating and general electrolytic copper plating (electrolytic copper plating which is not electrolytic filling plating) is used as a method for manufacturing the multilayer wiring board in which the hole for a via hole is not filled in (Patent Literature 1).

CITATION LIST

Patent Literature

Patent Literature 1: Japanese Unexamined Patent Publication No. 2008-182273

SUMMARY OF INVENTION

Technical Problem

For a hole for a via hole that is formed by laser processing according to a conformal method or a direct laser method, an overhang of a metal foil appears at the opening of the hole for a via hole serving as an entrance of laser processing, and due to this overhang of the metal foil, the opening in the cross-sectional shape of the hole for a via hole may be rather narrower than the inside or the bottom.

For such a hole for a via hole, in the case of carrying out electrolytic copper plating that does not fill in the hole for a via hole by using conventional general electrolytic copper plating, throwing power to the inside of the hole for a via hole is low. Therefore, in an attempt to form an electrolytic copper plating layer having a thickness for securing connection reliability, there is a problem that the electrolytic copper plating layer is formed thick even on the metal foil on the surface, and fine wiring properties are poor because the combined thickness of the metal foil on the surface and the electrolytic copper plating layer must be etched.

Furthermore, a method using electrolytic filling plating by which the plating layer is preferentially formed within the hole for a via hole is possible as a method for decreasing the thickness of the electrolytic copper plating layer on the metal foil on the surface. However, in the case of using electrolytic filling plating, there is a problem that an electrolytic filling plating layer deposited on the overhang of the metal foil at the opening blocks the opening of the hole for a via hole before the electrolytic filling plating fills the inside of the hole for a via hole, and is partly responsible for the occurrence of a plating void.

In recent years, a demand for miniaturization or thin models has been increasingly growing, and there is a tendency that the diameter of the hole for a via hole is smaller, the insulating layer thickness is thinner, and the aspect ratio is larger. However, there also exist many multilayer wiring boards having a hole for a via hole that has a relatively small aspect ratio and does not need to be filled with electrolytic filling plating (general hole for a via hole). Working by using electrolytic filling plating equipment for electrolytically copper-plating a hole for a via hole in such a multilayer wiring board is convenient for reducing equipment used and simplifying steps.

The present invention has been made in light of the problems described above, and an object thereof is to provide a method for manufacturing a multilayer wiring board which prevents an electrolytic plating layer on a metal foil on the surface from becoming thick, while suppressing the occurrence of a plating void within a hole for a via hole, and enables a general via hole that is not filled with electrolytic filling plating to be formed with electrolytic filling plating equipment.

Solution to Problem

The present invention relates to the following:
1. A method for manufacturing a multilayer wiring board, comprising: (1) a step of integrally laminating an inner layer material with an inner layer wiring pattern formed thereon, an insulating layer, and a metal foil for an upper layer wiring pattern, and providing the metal foil for an upper layer wiring pattern and the insulating layer with a hole for a via hole from the metal foil for an upper layer wiring pattern to the inner layer wiring pattern, an overhang of the metal foil for an upper layer wiring pattern formed at an opening of the hole for a via hole, and lower space formed between the overhang of the metal foil and an inside wall of the hole for a via hole, by using a conformal method or a direct laser method; (2) a step of forming a base electroless plating layer within the hole for a via hole and on the metal foil for an upper layer wiring pattern, and then forming a via hole that connects the metal foil for an upper layer wiring pattern and the inner layer wiring pattern, by forming electrolytic filling plating layers; and (3) a step of wiring the metal foil for an upper layer wiring pattern after the formation of the electrolytic filling plating layers to form the upper layer wiring pattern, wherein the formation of the electrolytic filling plating layers in the step (2) is carried out by repeating change in electric current density of temporarily decreasing the electric current density of electrolytic filling plating in the middle of the electrolytic filling plating, and then increasing it again, two or more times before the electrolytic filling plating layers block the opening of the hole for a via hole.

2. The method for manufacturing a multilayer wiring board according to item 1, wherein in the step (2), the change in electric current density of temporarily decreasing the electric current density of electrolytic filling plating and then increasing it again is repeated before the electrolytic filling plating layers block the opening of the hole for a via hole, whereby the electrolytic filling plating layers are formed in a form following the inside wall and the bottom face of the hole for a via hole.

3. The method for manufacturing a multilayer wiring board according to item 1 or 2, wherein in the step (2), the timing of temporarily decreasing the electric current density of electrolytic filling plating is before the electrolytic filling plating fills the lower space between the overhang of the metal foil for an upper layer wiring pattern formed at the opening of the hole for a via hole and the inside wall of the hole for a via hole, and a plating void is formed.

4. The method for manufacturing a multilayer wiring board according to any one of items 1 to 3, wherein in the step (2), the rate of decrease in electric current density in temporarily decreasing the electric current density of electrolytic filling plating in the middle of the electrolytic filling plating is 50% or more of that immediately before the decrease.

5. The method for manufacturing a multilayer wiring board according to any one of items 1 to 4, wherein in the step (2), the electric current density in temporarily decreasing the electric current density of electrolytic filling plating in the middle of the electrolytic filling plating, and then increasing it again is equal to or larger than the electric current density immediately before the temporal decrease.

Advantageous Effects of Invention

According to the present invention, a method for manufacturing a multilayer wiring board which prevents an electrolytic plating layer on a metal foil on the surface from becoming thick, while suppressing the occurrence of a plating void within a hole for a via hole, and enables a general via hole that is not filled with electrolytic filling plating to be formed with electrolytic filling plating equipment can be provided.

DESCRIPTION OF EMBODIMENTS

Figure 1:
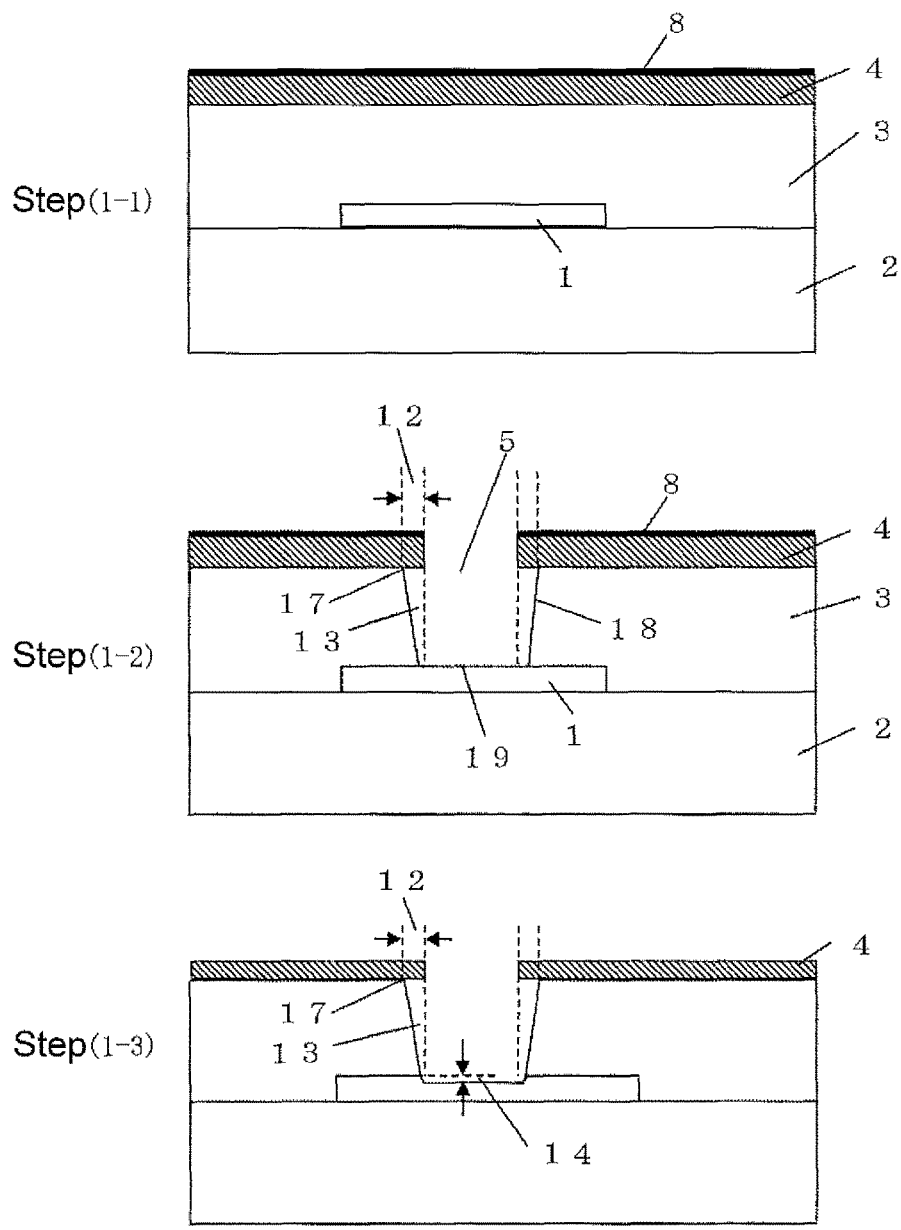
FIG. 1 shows step (1) of a method for manufacturing a multilayer wiring board of one embodiment (Examples 1 to 5) of the present invention.

The method for manufacturing a multilayer wiring board of the present invention includes a method for manufacturing a multilayer wiring board, comprising: (1) a step of integrally laminating an inner layer material with an inner layer wiring pattern formed thereon, an insulating layer, and a metal foil for an upper layer wiring pattern, and providing the metal foil for an upper layer wiring pattern and the insulating layer with a hole for a via hole from the metal foil for an upper layer wiring pattern to the inner layer wiring pattern, an overhang of the metal foil for an upper layer wiring pattern formed at an opening of this hole for a via hole, and lower space formed between this overhang of the metal foil and an inside wall of the hole for a via hole, by using a conformal method or a direct laser method; (2) a step of forming a base electroless plating layer within the hole for a via hole and on the metal foil for an upper layer wiring pattern, and then forming a via hole that connects the metal foil for an upper layer wiring pattern and the inner layer wiring pattern, by forming electrolytic filling plating layers; and (3) a step of wiring the metal foil for an upper layer wiring pattern after the formation of the electrolytic filling plating layers to form the upper layer wiring pattern, wherein the formation of the electrolytic filling plating layers in the step (2) is carried out by repeating change in electric current density of temporarily decreasing the electric current density of electrolytic filling plating in the middle of the electrolytic filling plating, and then increasing it again, two or more times before the electrolytic filling plating layers block the opening of the hole for a via hole.

In the method for manufacturing a multilayer wiring board of the present invention, since the hole for a via hole is created in the step (1) by using a conformal method or a direct laser method, an overhang of the metal foil for an upper layer wiring pattern develops at the opening of the hole for a via hole, and lower space is formed between this overhang of the metal foil for an upper layer wiring pattern and the inside wall of the hole for a via hole. An immediately lower portion, which is a region near the underside of the overhang of the metal foil for an upper layer wiring pattern becomes a region that resists the entrance of current of the electrolytic filling plating solution, in the lower space. Therefore, the lower space including this immediately lower portion is susceptible to the adsorption of the accelerator in the electrolytic filling plating solution, and at the initial stage of the electrolytic filling plating, an electrolytic filling plating layer is first formed in the lower space with this immediately lower portion as a starting point so that the lower space is filled. In this context, the lower space is space enclosed between the overhang of the metal foil for an upper layer wiring pattern and the inside wall of the hole for a via hole, and more specifically refers to space enclosed between a perpendicular drawn from the edge of the overhang of the metal foil for an upper layer wiring pattern to the bottom of the hole for a via hole and the inside wall of the hole for a via hole. Once the plating accelerator is adsorbed, it has the property of remaining as it is as long as the electrolytic filling plating is continued at the same electric current density. Therefore, if the electrolytic filling plating is continued at the same electric current density as in conventional techniques, the filling plating layer that has finished the filling of the lower space keeps growing with the immediately lower portion as a starting point and blocks the opening prior to the inside of the hole for a via hole. Therefore, there is a tendency that a plating void easily occurs in the inside of the hole for a via hole.

The immediately lower portion refers to a region near the underside of the overhang of the metal foil for an upper layer wiring pattern, in the lower space formed between the overhang of the metal foil for an upper layer wiring pattern and the inside wall of the hole for a via hole. This immediately lower portion is formed by the denting of the inside wall of the insulating layer immediately below the metal foil compared with the tip of the metal foil opening, because there is a large difference in laser processability (thermal decomposition temperature) between the resin constituting the insulating layer and the immediately upper metal foil in the case of forming the hole for a via hole by a conformal method or a direct laser method. Particularly, in the case of using a prepreg having reinforcing fiber as an insulating layer, a resin for bonding exists in the immediately lower portion of the metal foil, and this resin is more laser-processable than the reinforcing fiber. Thus, there is a tendency that the resin of the immediately lower portion is largely dented compared with the inside wall of the metal foil or in the inside of the hole for a via hole. Therefore, the accelerator in the electrolytic filling plating solution is easily adsorbed on this immediately lower portion. Therefore, there is a tendency that the electrolytic filling plating layer grows fast (thick) and blocks the opening of the hole for a via hole.

According to the method for manufacturing a multilayer wiring board of the present invention, the accelerator adsorbed on the electrolytic filling plating layer formed at the immediately lower portion of the lower space can be separated when the electric current density of electrolytic filling plating is temporarily decreased in the middle of the electrolytic filling plating. In this respect, as long as the electrolytic filling plating layer fills the lower space, and the diameter in the inside of the hole for a via hole is equal to or larger than the diameter of the opening, the plating inhibitor is easily adsorbed on the opening of the hole for a via hole corresponding to the immediately lower portion whereas the plating accelerator is easily adsorbed on the inside of the hole for a via hole. This effect is larger, particularly, when the electrolytic filling plating layer fills the lower space, and the filling plating layer is in a form deposited along the inside wall in the inside of the via hole. Therefore, since the growth of the electrolytic filling plating layer with the immediately lower portion as a starting point is inhibited after increasing the electric current density of electrolytic filling plating again, the electrolytic filling plating layer is preferentially formed in the inside of the hole for a via hole without blocking the opening of the hole for a via hole. By repeating this increase and suppression in the electric current density of electrolytic filling plating, the electrolytic filling plating layer can be deposited along the wall surface (inside wall) in the inside of the via hole to manufacture a conventional via hole that is not filled in (general via hole).

In the step (2), it is desirable that the timing of temporarily decreasing the electric current density of electrolytic filling plating should be set to when the cross-sectional shape of the via hole is in a state in which electrolytic filling plating fills the lower space between the overhang of the metal foil for an upper layer wiring pattern formed at the opening of the hole for a via hole and the inside wall of the hole for a via hole, the electrolytic filling plating layer is in a form deposited along the inside wall, and the electrolytic filling plating layer on the bottom face is thinner than that on the inside wall. In such a state in which the electrolytic filling plating layer fills the lower space, the electrolytic filling plating layer is in a form deposited along the inside wall in the inside of the hole for a via hole, and the electrolytic filling plating layer on the bottom face is thinner than that on the inside wall, an aspect ratio equal to or larger than an aspect ratio which is a ratio of a depth of the hole for a via hole to an opening size of the hole for a via hole before the electrolytic filling plating is maintained. Therefore, the plating inhibitor can be more easily adsorbed on the opening of the hole for a via hole whereas the accelerator can be more easily adsorbed on the inside of the hole for a via hole. Therefore, the throwing power of the electrolytic filling plating layer to the inside of the hole for a via hole is improved.

In the case where the opening is about 1.5 to 2 times larger than the thickness of the insulating layer and the aspect ratio is small, electrolytic filling plating deposition is also suppressed for the bottom face of the via hole, as with the superficial layer. Therefore, the filling plating layer thickness easily becomes equal to or smaller than superficial layer and is therefore preferred.

In the step (2), the timing of temporarily decreasing the electric current density of electrolytic filling plating is set to before the electrolytic filling plating fills the lower space between the overhang of the metal foil for an upper layer wiring pattern formed at the opening of the hole for a via hole and the inside wall of the hole for a via hole, and a plating void is formed. By this, the electrolytic filling plating layers can be more reliably formed without filling the inside of the hole for a via hole and also without forming a plating void.

In the step (2), it is desirable that the rate of decrease in electric current density in temporarily decreasing the electric current density of electrolytic filling plating in the middle of the electrolytic filling plating should be 50% or more of that immediately before the decrease. In this context, the rate of decrease in electric current density is percentage by which the electric current density is decreased, and means that, for example, in the case where the rate of decrease from an initial electric current density of 1 A/dm$^2$ is 50%, the electric current density after the decrease is 0.5 A/dm$^2$. Also, decreasing the electric current density includes adjusting the electric current density to 0 A/dm$^2$. By this, the plating accelerator adsorbed on the electrolytic filling plating layer formed at the immediately lower portion of the lower space can be reliably separated. Therefore, as long as the electrolytic filling plating layer fills the lower space, and the diameter in the inside of the hole for a via hole is equal to or larger than the diameter of the opening, the plating inhibitor can be more easily adsorbed on the opening of the hole for a via hole whereas the accelerator can be more easily adsorbed on the inside of the hole for a via hole.

In the step (2), it is desirable that the electric current density in, after temporarily decreasing the electric current density of electrolytic filling plating in the middle of the electrolytic filling plating and then increasing it again should be equal to or larger than the electric current density immediately before the temporal decrease. By this, the inside of the hole for a via hole can be filled with the electrolytic filling plating layers in a shorter time, and production efficiency is improved.

Furthermore, in the case of temporarily decreasing the electric current density in the middle of electrolytic filling copper plating as in the method for manufacturing a multilayer wiring board of the present invention, for example, a streak is observed between an electrolytic filling copper plating layer of the first stage before decreasing the electric current density and an electrolytic filling copper plating layer of the second stage after increasing the electric current density again. By this streak, the boundary of the electrolytic filling copper plating layer of the first stage and the electrolytic copper plating layer of the second stage can be identified. As a result, whether or not the state has been created in which the electrolytic filling copper plating layer of the first stage before decreasing the electric current density fills the lower space and is in a form deposited along the inside wall, and the electrolytic filling plating layer on the bottom face is thinner than that on the inside wall can be confirmed from the cross-sectional shape of the via hole. Furthermore, whether or not the formation of the electrolytic filling plating layers has been carried out by repeating change in electric current density of temporarily decreasing the electric current density of electrolytic filling plating in the middle of the electrolytic filling plating, and then increasing it again, two or more times before the electrolytic filling plating layers block the opening of the hole for a via hole, can be confirmed. Thus, it is also easy to control the conditions or the thickness of the electrolytic filling copper plating of the first stag before decreasing the electric current density.

It is desirable that the hole for a via hole should be a non-through hole. In forming the non-through hole by applying the conformal method or the direct laser method, the overhang of the metal foil for an upper layer wiring pattern develops at the opening of the hole for a via hole, and the lower space is easily formed between this overhang of the metal foil for an upper layer wiring pattern and the inside wall of the hole for a via hole. Furthermore, in the case where the hole for a via hole is a non-through hole, because of having a bottom, the inside of the hole for a via hole is more easily filled with the electrolytic filling plating layers by the action of the plating accelerator in the electrolytic filling plating solution, and a void in the hole for a via hole can be more reliably suppressed.

The inner layer material is one that is used in a general inner layer of a multilayer wiring board and is generally prepared by integrally laminating a metal foil consisting of copper, aluminum, brass, nickel, iron, or the like alone, as an alloy, or as a composite foil on the upper surface and/or lower surface of a required number of a resin-impregnated base material having a reinforcing base material impregnated with a resin composition, and forming a wiring pattern by the etching or the like of the metal foil.

The prepreg is one that serves as an insulating layer bonding the inner layer material to a copper foil for an upper layer wiring pattern, and refers to a resin film that is in a semi-cured B-stage state by impregnating a reinforcing base material such as glass fiber with a resin composition (resin varnish) and has adhesiveness. A prepreg that is used in a general multilayer wiring board can be employed as the prepreg. Alternatively, a resin film having no reinforcing base material such as glass fiber may be used instead of the prepreg. Examples of such a resin film having no reinforcing base material such as glass fiber include polymer epoxy resins and thermoplastic polyimide adhesive films, which are used for bonding an inner layer material to a copper foil for an upper layer wiring pattern in a multilayer wiring board.

A publicly known and conventional resin composition that is used as an insulating material of a multilayer wiring board can be used as the resin composition mentioned above. Usually, a thermosetting resin having favorable heat resistance and chemical resistance is used as a base, and one type or two or more types of resins such as phenol resin, epoxy resin, polyimide resin, unsaturated polyester resin, polyphenylene oxide resin, and fluorine resin are mixed and used, and, if necessary, supplemented with an inorganic powder filler such as talc, clay, silica, alumina, calcium carbonate, aluminum hydroxide, antimony trioxide, or antimony pentoxide, or a fibrous filler such as glass fiber, asbestos fiber, pulp fiber, synthetic fiber, or ceramic fiber.

Also, a thermoplastic resin may be blended with the resin composition in consideration of dielectric characteristics, impact resistance, film processability, etc. Further, various additives such as an organic solvent, a flame retardant, a curing agent, a curing accelerator, a thermoplastic particle, a colorant, a UV-opaque agent, an antioxidant, and a reducing agent, or fillers are added and prepared, if necessary.

A woven fabric, nonwoven fabric, paper, a mat, or the like of inorganic fiber such as glass or asbestos, organic fiber such as polyester, polyamide, polyacryl, polyvinyl alcohol, polyimide, or fluorine resin, or natural fiber such as cotton is used as the reinforcing base material mentioned above.

Usually, the reinforcing base material is impregnated or coated such that the amount of the resin composition attached to the reinforcing base material becomes 20 to 90% by mass in terms of a resin content of the prepreg after drying, and then dried by heating usually at a temperature of 100 to 200° C. for 1 to 30 minutes to obtain a prepreg in a semi-cured state (B-stage state). Heating and pressurization are performed in a constitution in which 1 to 20 such prepregs are usually layered and metal foils are disposed on both surfaces thereof. An approach for usual laminated plates can be applied as molding conditions. Usually, molding is performed at a temperature of 100 to 250° C. and a pressure of 2 to 100 kg/cm2 for a heating time in the range of 0.1 to 5 hours by using, for example, a multiplaten press, a multiplaten vacuum press, continuous molding, or an autoclave molding machine, or carried out under lamination conditions of 50 to 150° C. and 0.1 to 5 MPa and under reduced pressure or atmospheric conditions by using a vacuum lamination apparatus or the like. Although the thickness of the prepreg serving as an insulating layer differs depending on use, one having a thickness of 0.1 to 5.0 mm is usually preferred.

The metal foil can employ a foil of a metal that is used in a general multilayer wiring board. It is preferred in terms of electric characteristics that the surface roughness of the metal foil used in the present invention should be 2.0 µm or less for both surfaces in terms of ten point mean roughness (Rz) shown in JIS B0601. A copper foil, a nickel foil, an aluminum foil, or the like can be used as the metal foil, and a copper foil is usually employed. Conditions involving 50 to 100 g/L of sulfuric acid, 30 to 100 g/L of copper, a solution temperature of 20° C. to 80° C. and an electric current density of 0.5 to 100 $A/dm^2$ in the case of a copper sulfate bath, or conditions involving 100 to 700 g/L of potassium pyrophosphate, 10 to 50 g/L of copper, a solution temperature of 30° C. to 60° C., pH of 8 to 12, and an electric current density of 1 to 10 $A/dm^2$ in the case of a copper pyrophosphate bath are generally often used as manufacturing conditions for the copper foil, and various additives may be added in consideration of the physical properties or smoothness of copper.

Anti-rust treatment that is carried out for the resin bonding face of the metal foil can be carried out by using any of nickel, tin, zinc, chromium, molybdenum, and cobalt, or an alloy thereof. These perform thin film formation on the metal foil by sputtering, electroplating, or electroless plating, and electroplating is preferred in terms of cost. Although the amount of the anti-rust treatment metal differs depending on the type of the metal, 10 to 2000 µg/dm² in total is preferred. If the anti-rust treatment is too thick, etching inhibition and reduction in electric characteristics are caused. If it is too thin, it may become a factor for reduction in peel strength against resin. Further, if a chromate-treated layer is formed on the anti-rust treatment, it can suppress reduction in peel strength against resin and is therefore useful.

The via hole is a non-through interlayer connection hole in which plating layers for connecting two or more layers of wiring layers are formed, and an interstitial via hole (IVH) is included. The hole for a via hole is a non-through hole for forming the via hole and refers to a state before a plating layer is formed. Also, one in which a plating layer is formed on the intra-hole surface of the hole for a via hole as well as a filled via in which the inside of the hole is completely filled in with plating layers is also included. One in which the diameter of the via hole is from nearly equal to the thickness of the insulating layer to about 1.2 times or more this thickness is likely to form the conventional-type via hole that is not filled in (general via hole). However, if the diameter approaches a value nearly equal to the thickness of the insulating layer, the via hole is more easily filled, and a void more easily occurs within the via hole.

An electroless plating layer serving as a base for the electrolytic filling plating layers is an electroless plating layer disposed throughout the surface of a substrate after creating the hole for a via hole, and the surface of the metal foil for an upper layer wiring pattern, the intra-hole lateral face of the hole for a via hole, the inner layer wiring pattern surface on the bottom face within the hole for a via hole, etc., is plated. This electroless plating layer can be formed by using an electroless copper plating solution of thin coating type that is generally used in the manufacture of a multilayer wiring board.

The electrolytic filling plating layer refers to an electrolytic plating layer formed by an electrolytic filling plating solution. As for the thickness of this electrolytic filling plating layer, the thickness on the bottom face within the hole for a via hole is larger than the thickness on the metal foil for an upper layer wiring pattern. The thickness of the electrolytic filling plating layer of the first stage is preferably 1 to 10 µm, more preferably in the range of 2 to 5 µm, as a thickness on the metal foil for an upper layer wiring pattern, and is provided so as to be in the range of approximately 2 to 20 µm as a thickness on the inner layer wiring pattern on the bottom face within the hole for a via hole. Also, as for the thickness of the electrolytic filling plating layer of the second stage, the thickness on the metal foil for an upper layer wiring pattern is not limited as long as it can be employed as a wiring pattern and the hole for a via hole is able to be not completely filled in with the electrolytic filling plating layers. For the thickness on the metal foil for an upper layer wiring pattern, it is preferred to be in the range of 1 to 10 µm, and it is more preferred to be in the range of 2 to 5 µm.

The electrolytic filling plating solution is generally one in which a plating inhibitor that inhibits plating growth and a plating accelerator that accelerates plating growth have been added into a copper sulfate plating bath.

The plating inhibitor is difficult to adsorb on the inside of the hole for a via hole and easy to adsorb on substrate surface according to the diffusion rule of materials. By applying this, it is reportedly effective to fill the inside of the hole for a via hole with an electrolytic filling copper plating layer and form a smooth electrolytic filling copper plating layer on substrate surface at an immediately upper portion of the hole for a via hole and a portion other than the immediately upper portion of the hole for a via hole, by slowing down the plating growth rate of the substrate surface compared with the inside of the hole for a via hole. A polyether compound such as polyalkylene glycol, a nitrogen-containing compound such as a quaternary polyvinyl imidazolium compound or a copolymer of vinyl pyrrolidone and a quaternary vinyl imidazolium compound, or the like can be used as the plating inhibitor.

The plating accelerator is uniformly adsorbed on the bottom face and the lateral face within the hole for a via hole, and substrate surface, and subsequently, the surface area is decreased in the inside of the hole for a via hole with plating growth so that the distribution of the accelerator within the hole for a via hole becomes dense. By utilizing this, it is reportedly effective to fill the inside of the hole for a via hole with an electrolytic filling copper plating layer and form a smooth electrolytic filling copper plating layer on substrate surface at an immediately upper portion of the hole for a via hole and a portion other than the immediately upper portion of the hole for a via hole, as a result of accelerating the plating rate in the inside of the hole for a via hole compared with the plating rate of the substrate surface. A sulfur compound represented by sodium 3-mercapto-1-propanesulfonate or sodium 2-mercaptoethanesulfonate, or a sulfur compound represented by disodium bis-(3-sulfopropyl)-disulfide or the like can be used as the plating accelerator. These plating accelerators are also one type of additive that is called a brightener and added to a copper plating solution.

One or two or more of these plating inhibitors or plating accelerators are mixed and used. Their concentrations in aqueous solutions are not particularly limited, but can be used at a concentration of several ppm by mass to several % by mass.

Hereinafter, the method for manufacturing a multilayer wiring board of one embodiment of the present invention will be described with reference to FIGS. 1 to 3.

First, as shown in step (1-1) of FIG. 1, a prepreg 3 on an inner layer material 2 with an inner layer wiring pattern 1 formed thereon, and a copper foil 4 for an upper layer wiring pattern 10 as an upper layer thereof are integrally laminated, and the copper foil 4 for an upper layer wiring pattern 10 is provided with a blackened layer 8. Then, as shown in step (1-2) of FIG. 1, a hole 5 for a via hole is created by direct laser processing. An overhang 12 of the copper foil 4 for an upper layer wiring pattern 10 develops at an opening of the hole 5 for a via hole, and lower space 13 is formed between this overhang 12 of the copper foil 4 for an upper layer wiring pattern 10 and an inside wall 18 of the hole 5 for a via hole. The amount of this overhang (length of the overhang) of the copper foil 4 is 3 to 10 µm. Also, an immediately lower portion 17 is formed in a region near the underside of the overhang 12 of the copper foil 4 for an upper layer wiring pattern 10, in the lower space 13 formed between the overhang 12 of the copper foil 4 for an upper layer wiring pattern 10 and the inside wall 18 of the hole 5 for a via hole. In the present embodiment, the prepreg 3, which is a resin film having a reinforcing base material such as glass fiber, is used as the insulating layer 3 that bonds the inner layer material 2 to the copper foil 4 for an upper layer wiring pattern 10, while a resin film, such as a polymer epoxy resin or a thermoplastic polyimide adhesive film, which is used in a general multilayer wiring board and has no reinforcing base material can be used instead of this prepreg 3. Also, in the present embodiment, the copper foil 4 is used as the metal foil 4 for an upper layer wiring pattern 10, while a nickel foil, an aluminum foil, a composite foil thereof, or the like, which is used as a material for a multilayer wiring board can be used instead of this. Furthermore, the insulating layer 3 and the metal foil 4 may be formed by using a single-sided copper foil-clad resin film in which a resin film having a reinforcing base material or a resin film having no reinforcing base material is disposed on the copper foil 4.

The method for integrally laminating the prepreg on the wired inner layer material, and the copper foil as an upper layer thereof employs a method of laminating and pressing the inner layer material, the prepreg, and the copper foil, or a method of laminating a single-sided copper foil-clad resin film with the inner layer material. The thickness of the insulating layer is approximately 10 to 100 μm, desirably 20 to 60 μm, and the thickness of the copper foil is 3 to 12 μm.

In the present embodiment, since the prepreg is used as the insulating layer, the single-sided copper foil-clad resin film in this case is one having a constitution in which the prepreg (resin film having a reinforcing base material) is disposed on the copper foil. In the case of using a resin film having no reinforcing base material instead of the prepreg as the insulating layer, one in which a resin film, such as a polymer epoxy resin or a thermoplastic polyimide adhesive film, having no reinforcing base material is disposed on the copper foil is used.

The copper foil and the resin composition (resin varnish) that are used in the production of the single-sided copper foil-clad resin film employ similar ones to those used in a general multilayer wiring board. For example, the resin composition (resin varnish) is applied onto the copper foil by using a kiss coater, a roll coater, a comma coater, or the like, or a resin film in which the resin composition has a film shape in a B-stage state (semi-cured state) is laminated onto the copper foil. When the resin composition (resin varnish) is applied onto the copper foil, the resin varnish is heated and dried in order to create a B-stage state (semi-cured state). 1 to 30 minutes at a temperature of 100 to 200° C. are appropriate as this condition, and approximately 0.2 to 10% by mass is appropriate as the amount of a residual solvent in the resin composition (resin varnish) after the heating and drying. In the case of laminating the film-shaped resin onto the metal foil, conditions of 50 to 150° C. and 0.1 to 5 MPa and vacuum or atmospheric conditions are appropriate.

The blackened layer that is formed on the copper foil for an upper layer wiring pattern layer can be formed with a publicly known one that is formed for bonding the copper foil and the insulating layer in a general multilayer wiring board. Examples of such a blackened layer include one formed by forming asperities on the surface of the copper foil by copper oxide treatment or etching.

Furthermore, the laser that can be used in the formation of the hole for a via hole includes gas laser such as $CO_2$, CO, or excimer, and solid laser such as YAG. $CO_2$ laser easily obtains large output, and according to a direct laser method under development in recent years, the processing of a hole for a via hole having a diameter of 50 μm or smaller is also possible.

Next, as shown in step (1-3) of FIG. 1, half etching is performed with an etching solution such as an aqueous ferric chloride solution, sodium persulfate, or a sulfuric acid-hydrogen peroxide water mixed aqueous solution until the thickness of the copper foil 4 for an upper layer wiring pattern 10 mentioned above becomes approximately 1 to 5 μm. By this treatment, the blackened layer 8 formed on the copper foil 4 is removed. Also, a bottom 19 is etched in the via hole 15 so that a depression 14 occurs. By securing the amount of this depression 14 (amount of etching), laser processing residues on the bottom 19 of the via hole 15 can be removed, and reliability can be secured.

Next, resin residues present on the bottom of the hole 5 for a via hole are removed by carrying out desmear treatment. Then, as shown in step (2-1) of FIG. 2, catalytic nuclei are imparted onto the copper foil 4 and to the inside of the hole 5 for a via hole, and then, an electroless copper plating layer 6 is formed. For example, Activator Neoganth (trade name, manufactured by Atotech Japan K.K.; "Neoganth" is a registered trademark), which is a palladium ion catalyst, or HS201B (trade name, manufactured by Hitachi Chemical Co., Ltd.), which is a palladium colloid catalyst, is employed for the imparting of the catalytic nuclei. The amount of the palladium catalyst adsorbed onto the copper foil 4 in the present embodiment is in the range of 0.03 to 0.6 μg/cm$^2$, further desirably in the range of 0.05 to 0.3 μg/cm$^2$. The treatment temperature in adsorbing the palladium catalyst is preferably 10 to 40° C. The amount of the palladium catalyst adsorbed onto the copper foil 4 can be controlled by controlling the treatment time.

Furthermore, a commercially available electroless copper plating solution such as CUST2000 (trade name, manufactured by Hitachi Chemical Co., Ltd.; "CUST" is a registered trademark) or CUST201 (trade name, manufactured by Hitachi Chemical Co., Ltd.) can be employed in the formation of the electroless copper plating layer. These electroless copper plating solutions are composed mainly of copper sulfate, formalin, a complexing agent, and sodium hydroxide. The thickness of the electroless copper plating layer needs only to be a thickness that can perform feeds for forming a next electrolytic filling copper plating layer, and is in the range of 0.1 to 5 μm, more preferably in the range of 0.5 to 1.0 μm.

Figure 2:
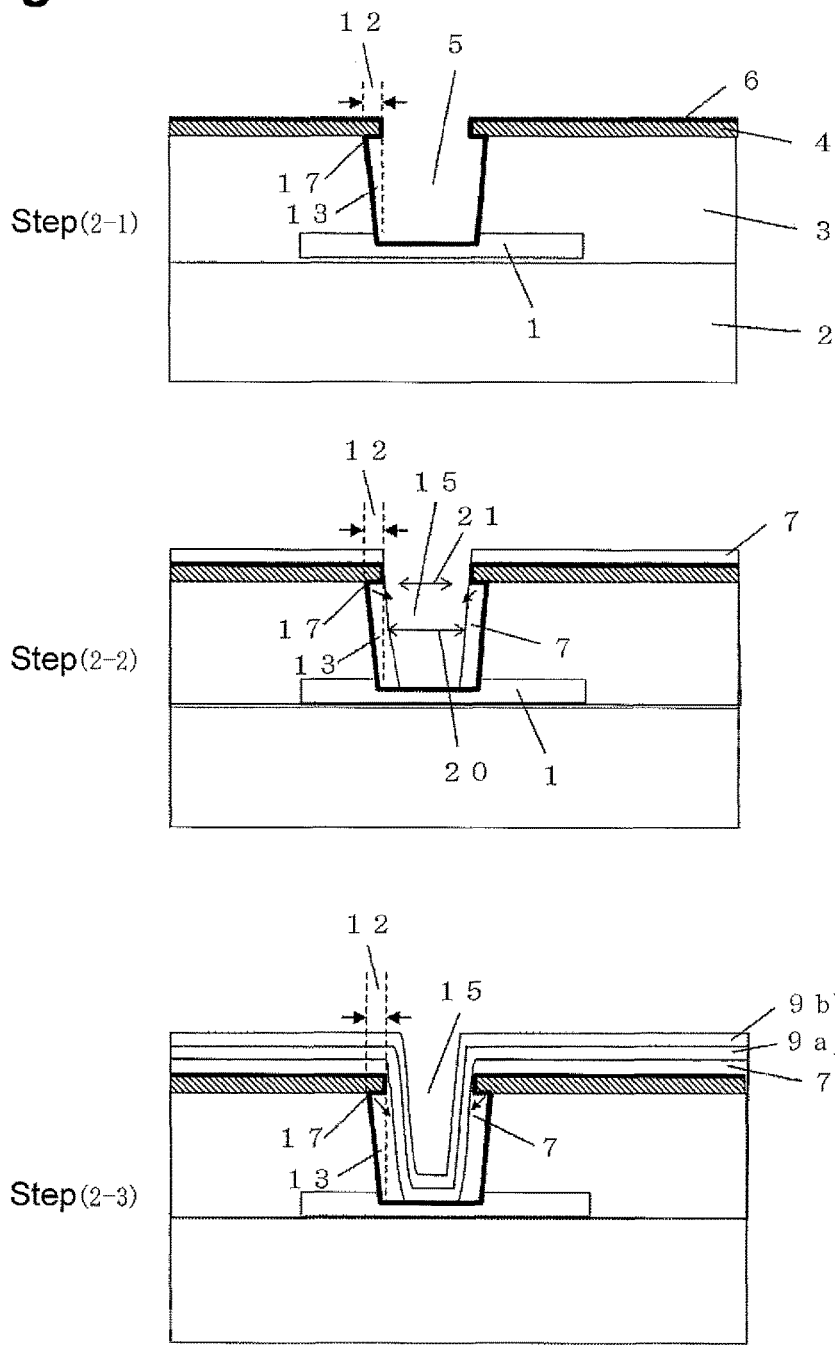
FIG. 2 shows step (2) of a method for manufacturing a multilayer wiring board of one embodiment (Examples 1 to 5) of the present invention.

Next, as shown in step (2-2) of FIG. 2, an electrolytic filling copper plating layer 7 of the first stage is formed on the formed electroless copper plating layer 6 to the extent that the hole 5 for a via hole is not completely filled in. More specifically, a state is created in which the electrolytic filling copper plating layer 7 of the first stage fills the lower space 13, and a diameter 20 in the inside of the via hole 15 is equal to or larger than a diameter 21 of the opening. Particularly, an octopus trap (tako-tsubo) shape in which the electrolytic filling copper plating layer 7 of the first stage fills the lower space 13, and the diameter 20 in the inside of the via hole 15 is larger than the diameter 21 of the opening is more preferred. As for the thickness of the electrolytic filling copper plating layer 7, the thickness of the electrolytic filling copper plating layer 7 on the bottom face within the hole 5 for a via hole is larger than the thickness of the electrolytic filling copper plating layer 7 on the copper foil 4 for an upper layer wiring pattern, and the thickness on the copper foil 4 for an upper layer wiring pattern is in the range of 1.0 to 5.0 μm while the thickness on the bottom face within the hole 5 for a via hole is provided in the range of approximately 1 to 20 μm. Conditions for such electrolytic filling copper plating are approximately 4 to 20 minutes at an electric current density of 1.0 A/dm$^2$.

Figure 5:
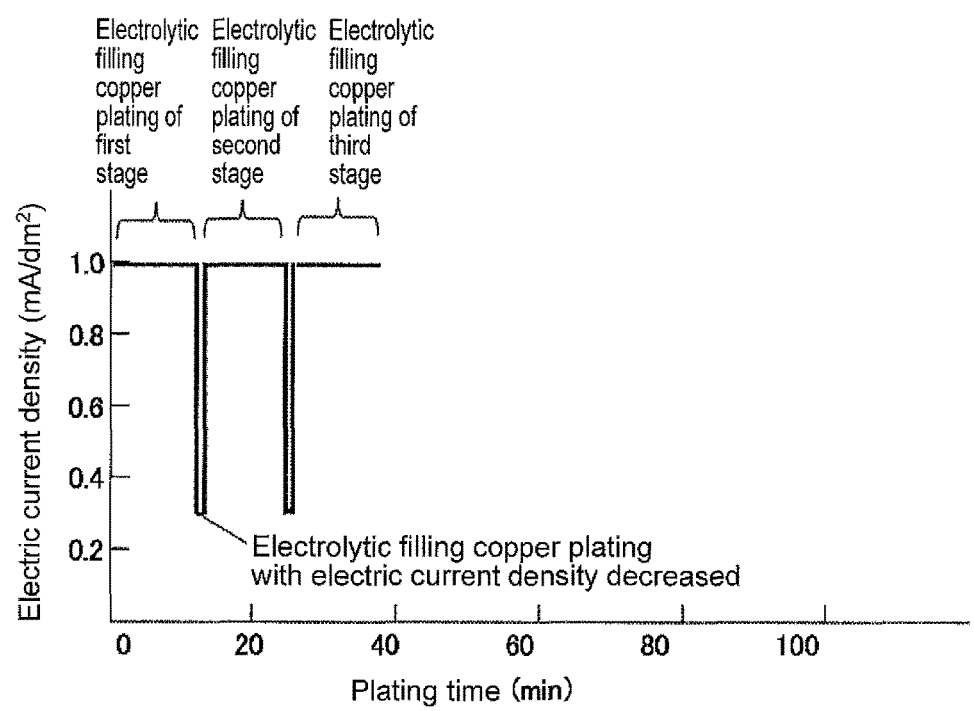
FIG. 5 shows the electric current density of electrolytic filling plating in a method for manufacturing a multilayer wiring board of one embodiment (Example 1) of the present invention.

Next, as shown in FIG. 5, the electric current density of electrolytic filling copper plating of the first stage is temporarily decreased to 0.3 A/dm$^2$ in the middle of the electrolytic filling copper plating of the first stage, and the electrolytic filling plating with the electric current density decreased is carried out for approximately 1 minute. By this, the plating accelerator adsorbed on the electrolytic filling plating layer formed in the lower space can be separated. The time of carrying out this electrolytic filling plating with the electric current density decreased, i.e., the time of maintaining the temporarily decreased electric current density of electrolytic filling copper plating has an effect of separating the plating accelerator if it is 1 second or longer, and 10 minutes or shorter are preferred because it precludes large reduction in the working efficiency of the electrolytic filling copper plating. In terms of the cross-sectional shape of the via hole 15 immediately before thus temporarily decreasing the electric current density, as shown in step (2-2) of FIG. 2, the lower space 13 formed between the overhang 12 of the copper foil 4 for an upper layer wiring pattern 10 and the inside wall 18 of the hole 5 for a via hole is filled with the electrolytic filling copper plating layer 7 of the first stage. In the present embodiment, an octopus trap (tako-tsubo) shape in which the diameter 20 in the inside of the via hole 15 is larger than the diameter 21 of the opening is created. In this way, the cross-sectional shape of the via hole 15 after forming the electrolytic filling plating layer 7 of the first stage has an octopus trap (tako-tsubo) shape in which the electrolytic filling plating layer 7 of the first stage fills the lower space 13, and the diameter 20 in the inside of the via hole 15 is larger than the diameter 21 of the opening, whereby the plating inhibitor is easily adsorbed on the opening of the hole 5 for a via hole corresponding to the immediately lower portion 17 of the copper foil 4 whereas the plating accelerator is easily adsorbed on the inside of the hole 5 for a via hole.

Next, as shown in FIG. 5, the electric current density of electrolytic filling plating is increased again to 1.0 A/dm$^2$, and electrolytic filling copper plating of the second stage is carried out. As shown in step (2-3) of FIG. 2, since the growth of the electrolytic filling plating layer 9 of the second stage with the immediately lower portion 17 as a starting point is inhibited in the electrolytic filling plating of the second stage after increasing the electric current density of electrolytic filling plating again, the electrolytic filling plating layer 9 of the second stage is preferentially formed in the inside of the hole 5 for a via hole without blocking the opening of the hole 5 for a via hole. Thus, even for a hole 5 for a via hole having a diameter nearly equal to an insulating layer 3 thickness, it becomes possible to suppress a plating void in the electrolytic filling plating layer 9 of the second stage. The accelerator adsorbed on the electrolytic filling plating layer can be separated again by decreasing the electric current density to 0.3 A/dm2 before the inside of the hole 5 for a via hole is completely filled in with this electrolytic filling copper plating layer 9 of the second stage. Provided that the electric current density of electrolytic filling plating is then increased to 1.0 A/dm2, and the electrolytic filling copper plating of the third stage is carried out, the electrolytic filling plating layer of the third stage is formed along the via shape without blocking the opening. This decrease and increase in electric current density are repeated until the desired conventional general via hole (via hole that is not filled in with electrolytic plating) is formed. Copper sulfate electroplating for filled vias that is used in a usual multilayer wiring board can be used in the electrolytic filling plating layers 9 of the second stage and the third stage or later, and the electrolytic filling plating solution used in forming the electrolytic filling copper plating layer 7 of the first stage is also acceptable, or a different one is acceptable. When the electrolytic filling copper plating solution that is employed in the formation of the electrolytic filling copper plating layer 7 of the first stage and the electrolytic filling copper plating layer 9 of the second stage is the same, the electrolytic filling copper plating of the first stage, the electrolytic filling copper plating with the electric current density decreased, and the electrolytic filling copper plating of the second stage can be formed in a state dipped in the same electrolytic filling copper plating solution, therefore resulting in good workability. The thickness of the electrolytic filling plating layers 9 of the second stage or the third stage or later is not limited as long as it can be employed as a wiring pattern and the via hole is not completely filled in with the conductor metal. For the thickness on the copper foil 4 for an upper layer wiring pattern and the electrolytic filling copper plating layer 7 of the first stage, it is preferred to be in the range of 1 to 100 μm, and it is more preferred to be in the range of 10 to 50 μm. Conditions for such electrolytic filling copper plating are approximately 4 to 400 minutes, preferably approximately 40 to 200 minutes, at an electric current density of 1.0 A/dm$^2$. In general, because copper is deposited more thick on the bottom of the hole for a via hole than the surface in electrolytic filling copper plating, a plating layer having connection reliability and other substrate characteristics can be formed on the bottom of the via hole at a relatively small superficial layer plating thickness.

Figure 3:
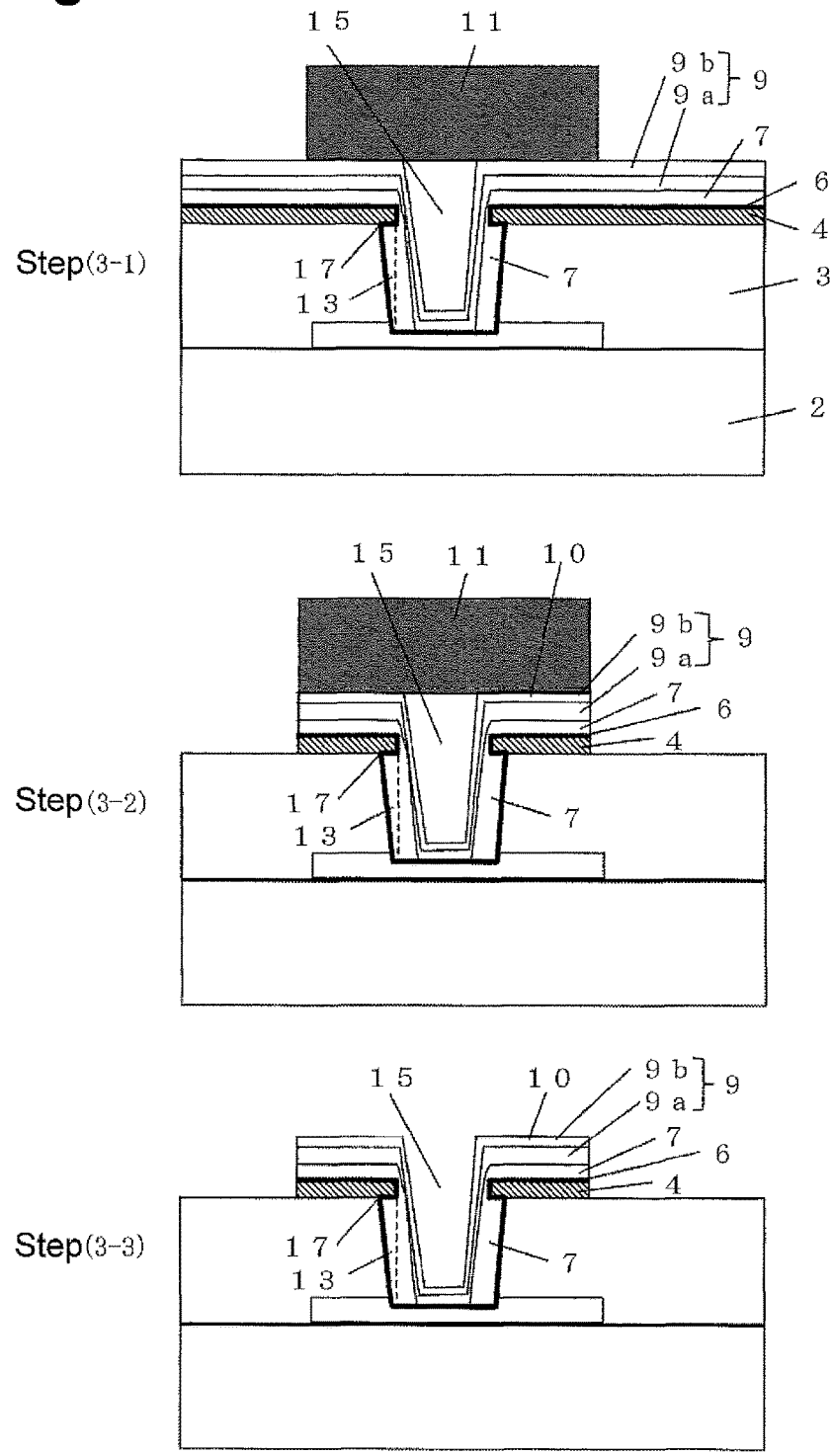
FIG. 3 shows step (3) of the method for manufacturing a multilayer wiring board of one embodiment (Examples 1 to 5) of the present invention.

Next, as shown in step (3-1) of FIG. 3, an etching resist 11 is formed by using a dry film resist or the like. The etching resist 11 is removed by development, except for a site on the hole 5 for a via hole and a site that should become the upper layer wiring pattern 10.

Next, as shown in step (3-2) of FIG. 3, a portion other than the upper layer wiring pattern 10 is removed by etching, and then, the stripping of the etching resist 11 is carried out by using an alkaline stripping solution, sulfuric acid, or a commercially available resist stripping solution to form the upper layer wiring pattern 10. By the method shown above, a multilayer wiring board consisting of two-layer wiring patters of the inner layer wiring pattern 1 and the upper layer wiring pattern 10 is finished. In the case of producing a multilayer wiring board having a larger number of layers of wiring patterns, the surface of the upper layer wiring pattern 10 of this multilayer wiring board is roughened, for example, to improve the adhesiveness with an insulating layer (not shown) formed on this upper layer wiring pattern 10, while a prepreg and a copper foil for an upper layer wiring pattern as an upper layer thereof are laminated, for example, for production.

EXAMPLES

Hereinafter, the present invention will be described with reference to Examples, and however, the present invention is not intended to be limited by the present Examples.

Example 1

First, as shown in step (1-1) of FIG. 1, a single-sided copper foil-clad resin film in which the thickness of a resin film serving as an insulating layer 3 was 60 μm, and the thickness of a copper foil 4 serving as a copper foil 4 for an upper layer wiring pattern 10 was 12 μm was vacuum-laminated on an inner layer material 2 with an inner layer wiring pattern 1 formed thereon under conditions of 120° C. and 2 MPa. Next, a blackened layer 8 having a thickness of 0.3 to 0.5 μm was formed on the surface of this copper foil 4 for an upper layer wiring pattern 10. Then, as shown in step (1-2) of FIG. 1, a hole 5 for a via hole having a diameter of 150 μm was processed by the direct laser method with $CO_2$ laser. Specifically, this hole 5 for a via hole had a depth of 72 μm in which the thickness (60 μm) of the resin film and the thickness (12 μm) of the copper foil 4 were summed, and the diameter of an opening of the copper foil 4 was 150 μm. Therefore, the aspect ratio was approximately 0.5. An overhang 12 of the copper foil 4 for an upper layer wiring pattern 10 developed at an opening of the hole 5 for a via hole, and lower space 13 was formed between this overhang 12 of the copper foil 4 for an upper layer wiring pattern 10 and an inside wall 18 of the hole 5 for a via hole. The amount of the overhang of the copper foil 4 was approximately 12 μm on one side of the hole 5 for a via hole. Also, an immediately lower portion 17 was formed in a region near the underside of the overhang 12 of the copper foil 4 for an upper layer wiring pattern 10, in the lower space 13 formed between the overhang 12 of the copper foil 4 for an upper layer wiring pattern 10 and the inside wall of the hole 5 for a via hole.

Next, as shown in step (1-3) of FIG. 1, half etching was performed with an etching solution such as an aqueous ferric chloride solution, ammonium persulfate, or a sulfuric acid-hydrogen peroxide water mixed aqueous solution until the thickness of the copper foil 4 became 9 to 10 μm in order to remove the blackened layer 8 on the copper foil 4 for an upper layer wiring pattern 10.

Next, resins attached to the bottom of a via hole were removed by carrying out desmear treatment. Then, as shown in step (2-1) of FIG. 2, catalytic nuclei were imparted onto the copper foil 4 and to the inside of the hole 5 for a via hole by using HS201B (trade name, manufactured by Hitachi Chemical Co., Ltd.), which is a palladium colloid catalyst, and then, an electroless copper plating layer 6 having a thickness of 0.5 μm and serving as a base for electrolytic filling copper plating was formed by using CUST2000 (trade name, manufactured by Hitachi Chemical Co., Ltd.; "CUST" is a registered trademark).

Next, as shown in step (2-2) of FIG. 2, an electrolytic filling copper plating layer 7 of the first stage of 3 μm as a thickness on the copper foil 4 for an upper layer wiring pattern 10 and 3 to 15 μm as a thickness on the bottom face 19 within the hole 5 for a via hole is formed. A commercially available direct current electrolytic plating solution CU-BRITE VFIV (trade name, manufactured by JCU Corp.) was used as an electrolytic filling copper plating solution. In this respect, conditions for the electrolytic filling copper plating of the first stage are approximately 13 minutes at an electric current density of 1.0 A/dm². In this case, the cross-sectional shape of the via hole 15 in which the electrolytic filling copper plating layer 7 of the first stage was formed had an octopus trap (tako-tsubo) shape in which the electrolytic filling plating layer 7 of the first stage filled the lower space 13, and the diameter 20 in the inside of the via hole 15 was larger than the diameter 21 of the opening.

Next, in order to temporarily decrease the electric current density of electrolytic filling copper plating, the power of the rectifier was temporarily turned off, and it was left for 1 minute with 0 A/dm² kept. Continuously therewith, as shown in step (2-3) of FIG. 2, an electrolytic filling copper plating layer 9a of the second stage of 3 μm as a thickness on the copper foil 4 for an upper layer wiring pattern 10 and the electrolytic filling copper plating layer 7 of the first stage was then formed. In this respect, conditions for the electrolytic filling copper plating of the second stage were approximately 13 minutes at an electric current density of 1.0 A/dm². During this, the substrate remained dipped in the electrolytic filling copper plating solution.

Next, in order to temporarily decrease the electric current density of electrolytic filling copper plating, the power of the rectifier was temporarily turned off, and it was left for 1 minute with 0 A/dm² kept. Continuously therewith, as shown in step (2-3) of FIG. 2, an electrolytic filling copper plating layer 9b of the third stage of 3 μm as a thickness on the electrolytic filling copper plating layer 9a of the second stage was then formed. In this respect, conditions for the electrolytic filling copper plating of the third stage were approximately 13 minutes at an electric current density of 1.0 A/dm². During this, the substrate remained dipped in the electrolytic filling copper plating solution. In this way, a multilayer wiring board in which the copper thickness of the superficial layer was approximately 19 μm was produced.

Next, as shown in step (3-1) of FIG. 3, an etching resist 11 having a thickness of 29 μm is formed by using SL-1229 (trade name, Hitachi Chemical Co., Ltd.), which is a dry film resist. The etching resist 11 is removed, except for a site on the hole 5 for a via hole and a site that should become the upper layer wiring pattern 10. Next, as shown in step (3-2) of FIG. 3, copper other than the upper layer wiring pattern 10 was removed by etching, and then, the stripping of the etching resist 11 was carried out by using an alkaline stripping solution, sulfuric acid, or a commercially available resist stripping solution to form the upper layer wiring pattern 10.

Example 2

Step (1-1) of FIG. 1 to step (2-1) of FIG. 2 were taken in the same way as in Example 1. Next, as shown in step (2-2) of FIG. 2, an electrolytic filling copper plating layer 7 of the first stage of 3 μm as a thickness on the copper foil 4 for an upper layer wiring pattern 10 and 3 to 15 μm as a thickness on the bottom face 19 within the hole 5 for a via hole is formed. The same one as in Example 1 was used as an electrolytic filling copper plating solution. In this respect, conditions for the electrolytic filling copper plating of the first stage were approximately 13 minutes at an electric current density of 1.0 A/dm².

Next, the electric current density of electrolytic filling copper plating was dropped from 1.0 A/dm² to 0.3 A/dm², which was kept for 1 minute, while the electrolytic filling copper plating was continued. Continuously therewith, as shown in step (2-3) of FIG. 2, an electrolytic filling copper plating layer 9a of the second stage of 3 μm as a thickness on the copper foil 4 for an upper layer wiring pattern 10 and the electrolytic filling copper plating layer 7 of the first stage was then formed. In this respect, conditions for the electrolytic filling copper plating of the second stage were approximately 13 minutes at an electric current density of 1.0 A/dm². During this, the substrate remained dipped in the electrolytic filling copper plating solution. Next, the electric current density of electrolytic filling copper plating was dropped from 1.0 A/dm² to 0.3 A/dm², which was kept for 1 minute, while the electrolytic filling copper plating was continued to form an electrolytic filling copper plating layer 9b of the third stage of 3 μm as a thickness on the electrolytic filling copper plating layer 9a of the second stage. In this respect, conditions for the electrolytic filling copper plating of the third stage were approximately 13 minutes at an electric current density of 1.0 A/dm². Next, steps (3-1) to (3-3) of FIG. 3 were taken in the same way as in Example 1.

Example 3

Step (1-1) of FIG. 1 to step (2-1) of FIG. 2 were taken in the same way as in Example 1. Next, as shown in step (2-2)

of FIG. 2, an electrolytic filling copper plating layer 7 of the first stage of 3 μm as a thickness on the copper foil 4 for an upper layer wiring pattern 10 and 3 to 15 μm as a thickness on the bottom face 19 within the hole 5 for a via hole is formed. The same one as in Example 1 was used as an electrolytic plating solution. In this respect, conditions for the electrolytic filling copper plating of the first stage were approximately 13 minutes at an electric current density of 1.0 A/dm$^2$.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 2, an electrolytic filling copper plating layer 9a of the second stage of 3 μm as a thickness on the copper foil 4 for an upper layer wiring pattern 10 and the electrolytic filling copper plating layer 7 of the first stage was then formed. In this respect, conditions for the electrolytic filling copper plating of the second stage were approximately 13 minutes at an electric current density of 1.0 A/dm$^2$. During this, the substrate remained dipped in the electrolytic filling copper plating solution. Next, the electric current density of electrolytic filling copper plating was dropped from 1.0 A/dm$^2$ to 0.5 A/dm$^2$, which was kept for 1 minute, while the electrolytic filling copper plating was continued to form an electrolytic filling copper plating layer 9b of the third stage of 3 μm as a thickness on the electrolytic filling copper plating layer 9a of the second stage. In this respect, conditions for the electrolytic filling copper plating of the third stage were approximately 13 minutes at an electric current density of 1.0 A/dm$^2$. Next, steps (3-1) to (3-3) of FIG. 3 were taken in the same way as in Example 1.

Example 4

Step (1-1) of FIG. 1 to step (2-1) of FIG. 2 were taken in the same way as in Example 1. Next, as shown in step (2-2) of FIG. 2, an electrolytic filling copper plating layer 7 of the first stage of 3 μm as a thickness on the copper foil 4 for an upper layer wiring pattern 10 and 3 to 15 μm as a thickness on the bottom face 19 within the hole 5 for a via hole is formed. The same one as in Example 1 was used as an electrolytic plating solution. In this respect, conditions for the electrolytic filling copper plating of the first stage were approximately 13 minutes at an electric current density of 1.0 A/dm$^2$.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 2, an electrolytic filling copper plating layer 9a of the second stage of 18 μm as a thickness on the copper foil 4 for an upper layer wiring pattern 10 and the electrolytic filling copper plating layer 7 of the first stage was then formed. In this respect, conditions for the electrolytic filling copper plating of the second stage were approximately 9 minutes at an electric current density of 1.5 A/dm$^2$. During this, the substrate remained dipped in the electrolytic filling copper plating solution. Next, the electric current density of electrolytic filling copper plating was dropped from 1.5 A/dm$^2$ to 0.3 A/dm$^2$, which was kept for 1 minute, while the electrolytic filling copper plating was continued to form an electrolytic filling copper plating layer 9b of the third stage of 3 μm as a thickness on the electrolytic filling copper plating layer 9a of the second stage. In this respect, conditions for the electrolytic filling copper plating of the third stage were approximately 9 minutes at an electric current density of 1.5 A/dm$^2$. Next, steps (3-1) to (3-3) of FIG. 3 were taken in the same way as in Example 1.

Example 5

Step (1-1) of FIG. 1 to step (2-1) of FIG. 2 were taken in the same way as in Example 1. Next, as shown in step (2-2) of FIG. 2, an electrolytic filling copper plating layer 7 of the first stage of 1 μm as a thickness on the copper foil 4 for an upper layer wiring pattern 10 and 1 to 7 μm as a thickness on the bottom face 19 within the hole 5 for a via hole is formed. The same one as in Example 1 was used as an electrolytic filling plating solution. In this respect, conditions for the electrolytic filling copper plating of the first stage were approximately 4 minutes at an electric current density of 1.0 A/dm$^2$.

Next, the electric current density of electrolytic filling copper plating was dropped from 1.0 A/dm$^2$ to 0.5 A/dm$^2$, which was kept for 1 minute, while the electrolytic filling copper plating was continued. Continuously therewith, as shown in step (2-3) of FIG. 2, the filling of the via hole 15 was then carried out with an electrolytic filling copper plating layer 9a of the second stage of 3 μm as a thickness on the copper foil 4 for an upper layer wiring pattern 10 and the electrolytic filling copper plating layer 7 of the first stage. In this respect, conditions for the electrolytic filling copper plating of the second stage were approximately 13 minutes at an electric current density of 1.0 A/dm$^2$. During this, the substrate remained dipped in the electrolytic filling copper plating solution. Next, the electric current density of electrolytic filling copper plating was dropped from 1.0 A/dm$^2$ to 0.3 A/dm$^2$, which was kept for 1 minute, while the electrolytic filling copper plating was continued to form an electrolytic filling copper plating layer 9b of the third stage of 3 μm as a thickness on the electrolytic filling copper plating layer 9a of the second stage. In this respect, conditions for the electrolytic filling copper plating of the third stage were approximately 13 minutes at an electric current density of 1.0 A/dm$^2$. Next, steps (3-1) to (3-3) of FIG. 3 were taken in the same way as in Example 1.

Comparative Example

Figure 4:
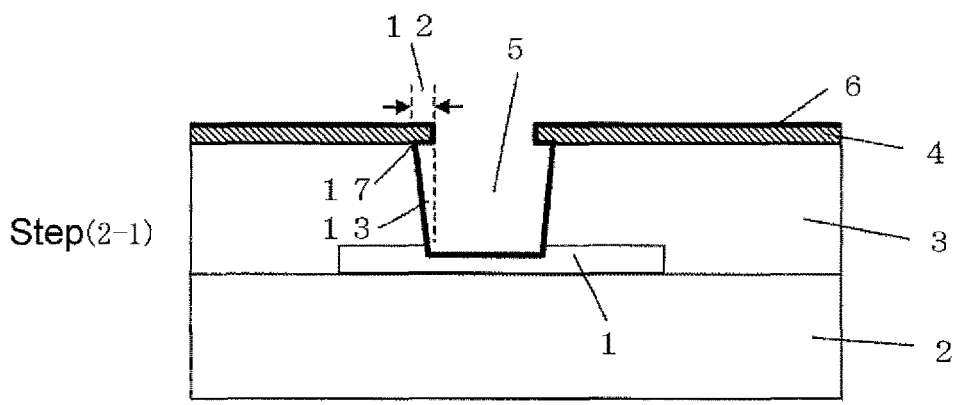
FIG. 4 shows step (2) of a method for manufacturing a multilayer wiring board of Comparative Example.
Figure 4:
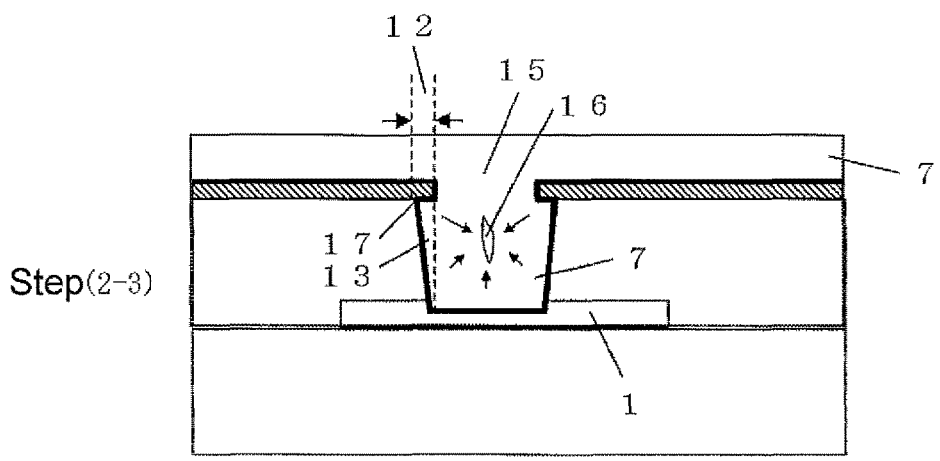

Step (1-1) of FIG. 1 to step (2-1) of FIG. 2 were taken in the same way as in Example 1. Next, as shown in step (2-2) of FIG. 4, an electrolytic filling copper plating layer 7 of the first stage of 12 μm as a thickness on the copper foil 4 for an upper layer wiring pattern 10 was formed in one stage. The same one as in Example 1 was used as an electrolytic filling copper plating solution. In this respect, conditions for the electrolytic filling copper plating of the first stage were approximately 54 minutes at an electric current density of 1.0 A/dm$^2$. Next, steps (3-1) to (3-3) of FIG. 3 were taken in the same way as in Example 1.

The cross-sectional shape was summarized in Table 1 by observing the cross section of the via hole under a microscope in Examples 1 to 5 and Comparative Example. In Examples 1 to 5, a shape in which the via hole was not filled as conventional was able to be obtained. On the other hand, in Comparative Example 1, a shape in which the 80% of the via hole was filled was obtained, though void occurrence was absent. Furthermore, in Examples 1 to 5 in which the electric current density was temporarily decreased in the middle of electrolytic filling copper plating, a streak was observed between the electrolytic filling copper plating layer of the first stage and the electrolytic filling copper plating layer of the second stage and the third stage. By this streak, the boundary of the electrolytic filling copper plating layer of the first stage and the electrolytic copper plating layer of the second stage and the third stage was able to be identified. As a result, the cross-sectional shape of the via hole in Examples 1 to 5 was able to be confirmed to have an octopus trap (tako-tsubo) shape in which the electrolytic filling copper plating layer of the first stage filled the lower space, and the diameter in the inside of the via hole was larger than the diameter of the opening. On the other hand, in the cross-sectional shape of the via hole of Comparative Example, the streak indicating the boundary of the electrolytic filling copper plating layer of the first stage and the electrolytic copper plating layer of the second stage was not observed.

TABLE 1

| Item | Example 1 | Example 2 | Example 3 | Example 4 | Example 5 | Comparative Example |
|---|---|---|---|---|---|---|
| Electrolytic filling plating of first stage | 1.0 A/dm2 × 13 min | 1.0 A/dm2 × 13 min | 1.0 A/dm2 × 13 min | 1.0 A/dm2 × 13 min | 1.0 A/dm2 × 4 min | 1.0 A/dm2 × 54 min |
| Electrolytic filling plating with electric current decreased | 0.0 A/dm2 × 1 min | 0.3 A/dm2 × 1 min | 0.5 A/dm2 × 1 min | 0.5 A/dm2 × 1 min | 0.5 A/dm2 × 1 min | — |
| Electrolytic filling plating of second stage | 1.0 A/dm2 × 13 min | 1.0 A/dm2 × 13 min | 1.0 A/dm2 × 13 min | 1.5 A/dm2 × 9 min | 1.0 A/dm2 × 13 min | — |
| Electrolytic filling plating with electric current decreased | 0.0 A/dm2 × 1 min | 0.3 A/dm2 × 1 min | 0.5 A/dm2 × 1 min | 0.3 A/dm2 × 1 min | 0.3 A/dm2 × 1 min | — |
| Electrolytic filling plating of third stage | 1.0 A/dm2 × 13 min | 1.0 A/dm2 × 13 min | 1.0 A/dm2 × 13 min | 1.5 A/dm2 × 9 min | 1.0 A/dm2 × 13 min | — |
| Shape | General via hole | General via hole | General via hole | General via hole | General via hole | Via hole, approximately 80% of which was filled |

REFERENCE SIGNS LIST

1. Inner layer wiring pattern
2. Inner layer material
3. Prepreg or insulating layer
4. Metal foil or copper foil
5. Hole for via hole
6. Electroless plating layer or electroless copper plating layer
7. Electrolytic filling plating layer of the first stage or electrolytic filling copper plating layer of the first stage
8. Blackened layer
9. Electrolytic filling plating layer of the second stage or later, or electrolytic filling copper plating layer of the second stage or later
9a Electrolytic filling plating layer of the second stage or electrolytic filling copper plating layer of the second stage
9b Electrolytic filling plating layer of the third stage or electrolytic filling copper plating layer of the third stage
10. Upper layer wiring pattern
11. Etching resist
12. Overhang of the metal foil
13. Lower space
14. Depression
15. Via hole or Interlayer connection
16. Void
17. Immediately lower portion
18. Inside wall
19. Bottom or bottom face
20. Diameter (in the inside)
21. Diameter (of the opening)

The invention claimed is:

1. A method for manufacturing a multilayer wiring board, comprising:
   (1) a step of integrally laminating an inner layer material with an inner layer wiring pattern formed thereon, an insulating layer, and a metal foil for an upper layer wiring pattern, and providing the metal foil for an upper layer wiring pattern and the insulating layer with a hole for a via hole from the metal foil for an upper layer wiring pattern to the inner layer wiring pattern, an overhang of the metal foil for an upper layer wiring pattern formed at an opening of the hole for a via hole, and lower space formed between the overhang of the metal foil and an inside wall of the hole for a via hole by using a conformal method or a direct laser method;
   (2) a step of forming a base electroless plating layer within the hole for a via hole and on the metal foil for an upper layer wiring pattern, and then forming a via hole that connects the metal foil for an upper layer wiring pattern and the inner layer wiring pattern, by forming electrolytic filling plating layers; and
   (3) a step of wiring the metal foil for an upper layer wiring pattern after the formation of the electrolytic filling plating layers to form the upper layer wiring pattern,
   wherein the formation of the electrolytic filling plating layers in the step (2) is carried out by repeating change in electric current density of temporarily decreasing the electric current density of electrolytic filling plating in the middle of the electrolytic filling plating, and then increasing it again, two or more times before the electrolytic filling plating layers block the opening of the hole for a via hole.

2. The method for manufacturing a multilayer wiring board according to claim 1,
   wherein in the step (2), the change in electric current density of temporarily decreasing the electric current density of electrolytic filling plating and then increasing it again is repeated two or more times before the electrolytic filling plating layers block the opening of the hole for a via hole, whereby the electrolytic filling plating layers are formed in a form following the inside wall and the bottom face of the hole for a via hole.

3. The method for manufacturing a multilayer wiring board according to claim 1, wherein in the step (2), the timing of temporarily decreasing the electric current density of electrolytic filling plating is before the electrolytic filling plating fills the lower space between the overhang of the metal foil for an upper layer wiring pattern formed at the opening of the hole for a via hole and the inside wall of the hole for a via hole, and a plating void is formed.

4. The method for manufacturing a multilayer wiring board according to claim 1,
wherein in the step (2), the rate of decrease in electric current density in temporarily decreasing the electric current density of electrolytic filling plating in the middle of the electrolytic filling plating is 50% or more of that immediately before the decrease.

5. The method for manufacturing a multilayer wiring board according to claim 1,
wherein in the step (2), the electric current density in temporarily decreasing the electric current density of electrolytic filling plating in the middle of the electrolytic filling plating and then increasing it again is equal to or larger than the electric current density immediately before the temporal decrease.

\* \* \* \* \*